(12) United States Patent
Liu et al.

(10) Patent No.: US 8,552,298 B2
(45) Date of Patent: Oct. 8, 2013

(54) CHASSIS WITH FIXING APPARATUS FOR MOUNTING MOTHERBOARDS

(75) Inventors: Yang Liu, Shenzhen (CN); Lei Liu, Shenzhen (CN); Cheng-Fei Weng, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 136 days.

(21) Appl. No.: 13/332,388

(22) Filed: Dec. 21, 2011

(65) Prior Publication Data

US 2013/0147325 A1    Jun. 13, 2013

(30) Foreign Application Priority Data

Dec. 8, 2011  (CN) .......................... 2011 1 0405766

(51) Int. Cl.
H01F 27/32 (2006.01)

(52) U.S. Cl.
USPC .................... 174/138 E; 174/138 G; 361/742; 361/758; 361/759; 361/770; 361/804

(58) Field of Classification Search
USPC ................. 361/807, 809, 810, 730, 736, 742, 361/747, 758, 759, 770, 791, 804, 760; 312/223.2; 439/225; 248/309.1
See application file for complete search history.

(56) References Cited

U.S. PATENT DOCUMENTS

| | | | | |
|---|---|---|---|---|
| 3,688,635 A | * | 9/1972 | Fegen ........................ | 174/138 A |
| 6,259,032 B1 | * | 7/2001 | Fernandez ................ | 174/138 E |
| 6,813,161 B2 | * | 11/2004 | Le et al. ........................ | 361/758 |
| 7,004,764 B2 | * | 2/2006 | Boudreau et al. ............... | 439/74 |
| 7,034,223 B2 | * | 4/2006 | Fan et al. ........................ | 174/51 |
| 7,212,400 B2 | * | 5/2007 | Fan et al. ................ | 361/679.58 |
| 7,430,129 B1 | * | 9/2008 | Peng ............................ | 361/807 |
| 7,521,636 B1 | * | 4/2009 | Chuang .................... | 174/138 G |
| 7,876,569 B2 | * | 1/2011 | Xue ............................. | 361/759 |

* cited by examiner

Primary Examiner — Hoa C Nguyen
Assistant Examiner — Christopher L Augustin
(74) Attorney, Agent, or Firm — Altis & Wispro Law Group, Inc.

(57) ABSTRACT

A chassis includes a number of fixing apparatuses, which enables various motherboards with different mounting holes layouts to be selectively mounted in the chassis. Each of the fixing apparatuses includes a base member secured to the chassis, and a fastening member rotatably connected to the base. The fastening member defines a fastening hole extending through an end of the fastening member. Each of the fixing apparatuses is rotatable between a fastening position and an interference avoiding position. To mount one of the motherboards, some of the fastening members are rotated to the fastening-ready positions to align the fastening holes of the fastening members with the corresponding mounting holes of the motherboard, and other fastening members are rotated to the interference-avoiding position to avoid interfering with the motherboard.

12 Claims, 5 Drawing Sheets

CHASSIS WITH FIXING APPARATUS FOR MOUNTING MOTHERBOARDS

BACKGROUND

1. Technical Field

The present disclosure relates to a chassis with a fixing apparatus for the mounting of motherboards.

2. Description of Related Art

An electronic device, such as a computer, includes a chassis and a motherboard mounted in the chassis. The motherboard defines a plurality of locating holes. A plurality of internally threaded standoffs is secured to the chassis to align with the corresponding locating holes of the motherboard. Therefore, the motherboard is fixed to the chassis with a plurality of screws extending through the locating holes of the motherboard and engaged in the corresponding standoffs. Various motherboards may have different layouts of locating holes, while a layout of the standoffs of a chassis is unchangeable. Therefore, only the motherboard with a particular layout of locating holes can be mounted to a chassis with same layout of standoffs, thus, it is not flexible for using motherboards with different configurations.

BRIEF DESCRIPTION OF THE DRAWINGS

Many aspects of the present embodiments can be better understood with reference to the following drawing. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
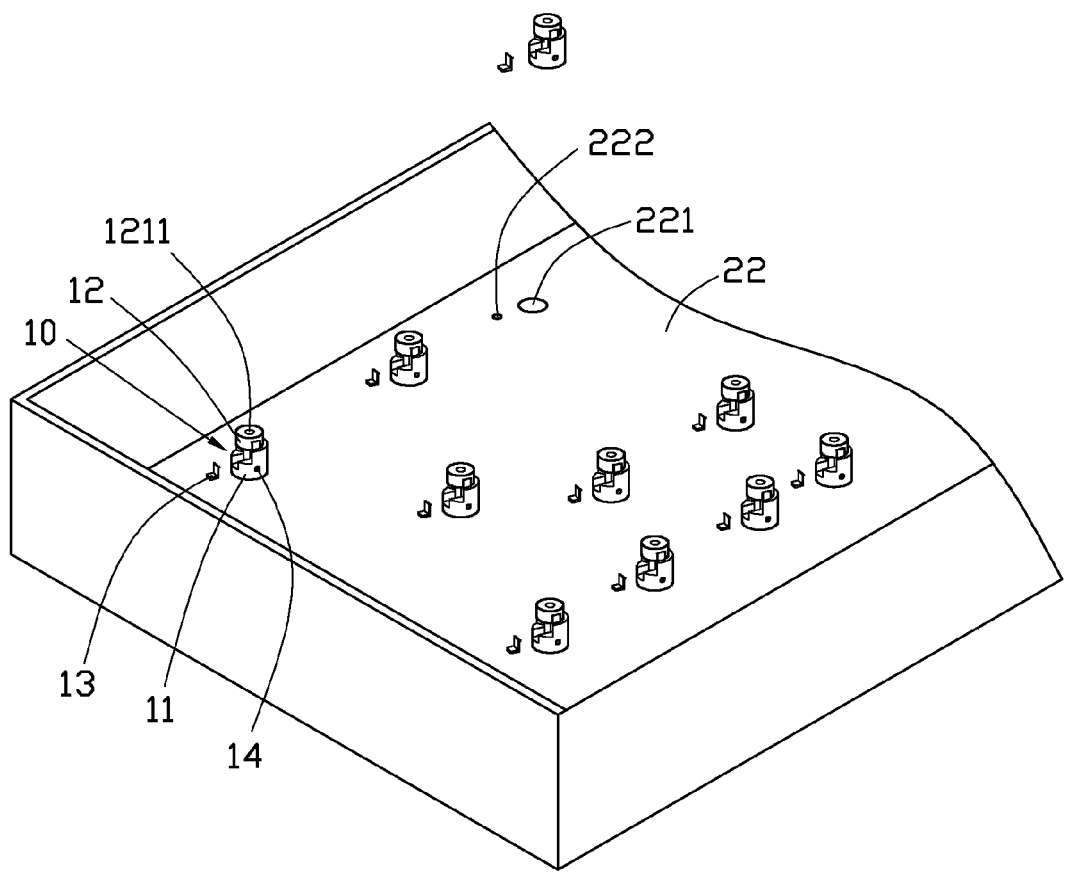
FIG. 1 is a partially exploded, isometric view of an exemplary embodiment of a chassis, wherein the chassis includes a plurality of fixing apparatus.
Figure 3:
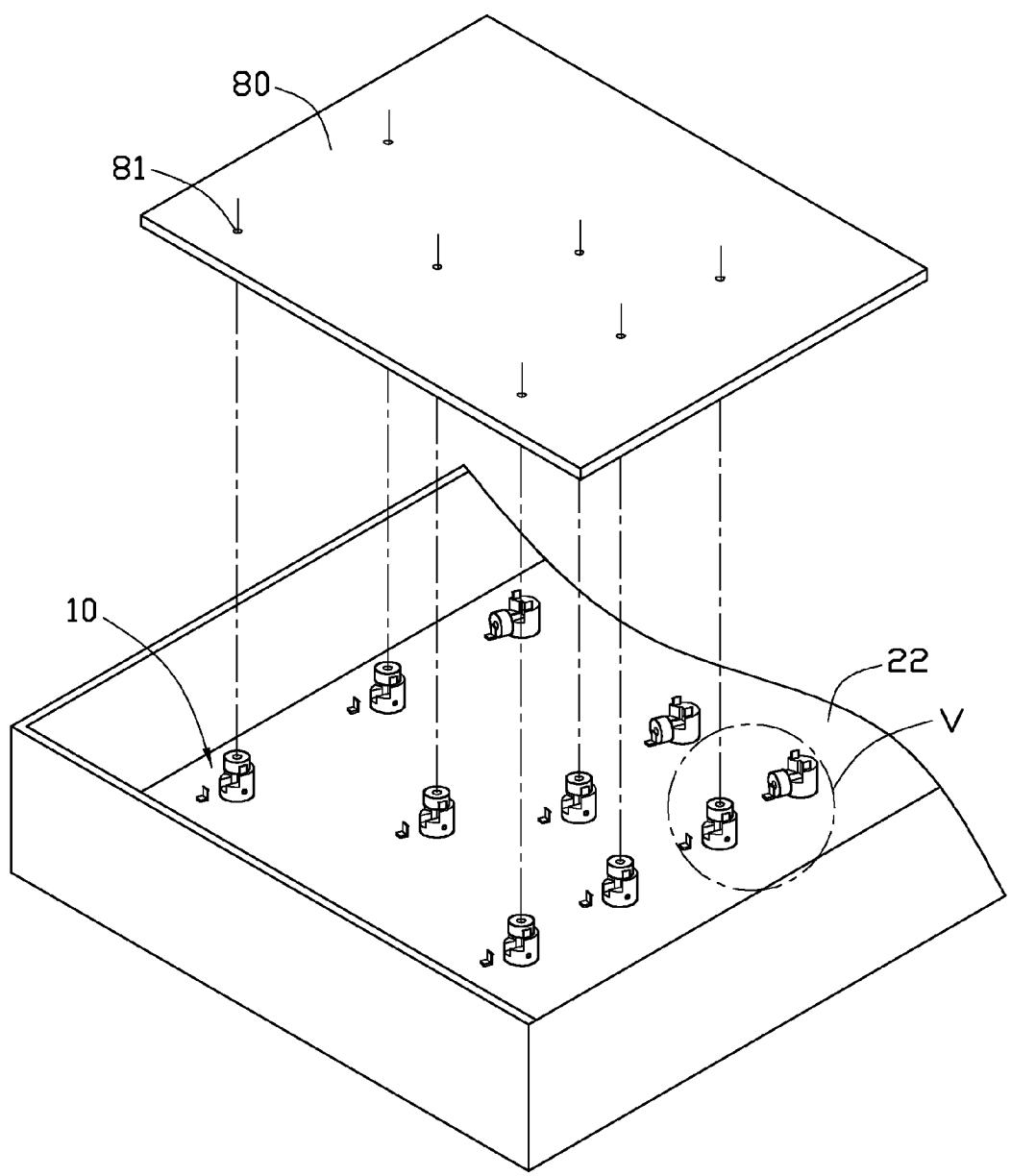
FIG. 3 shows a first motherboard to be mounted to the chassis of FIG. 1.
Figure 4:
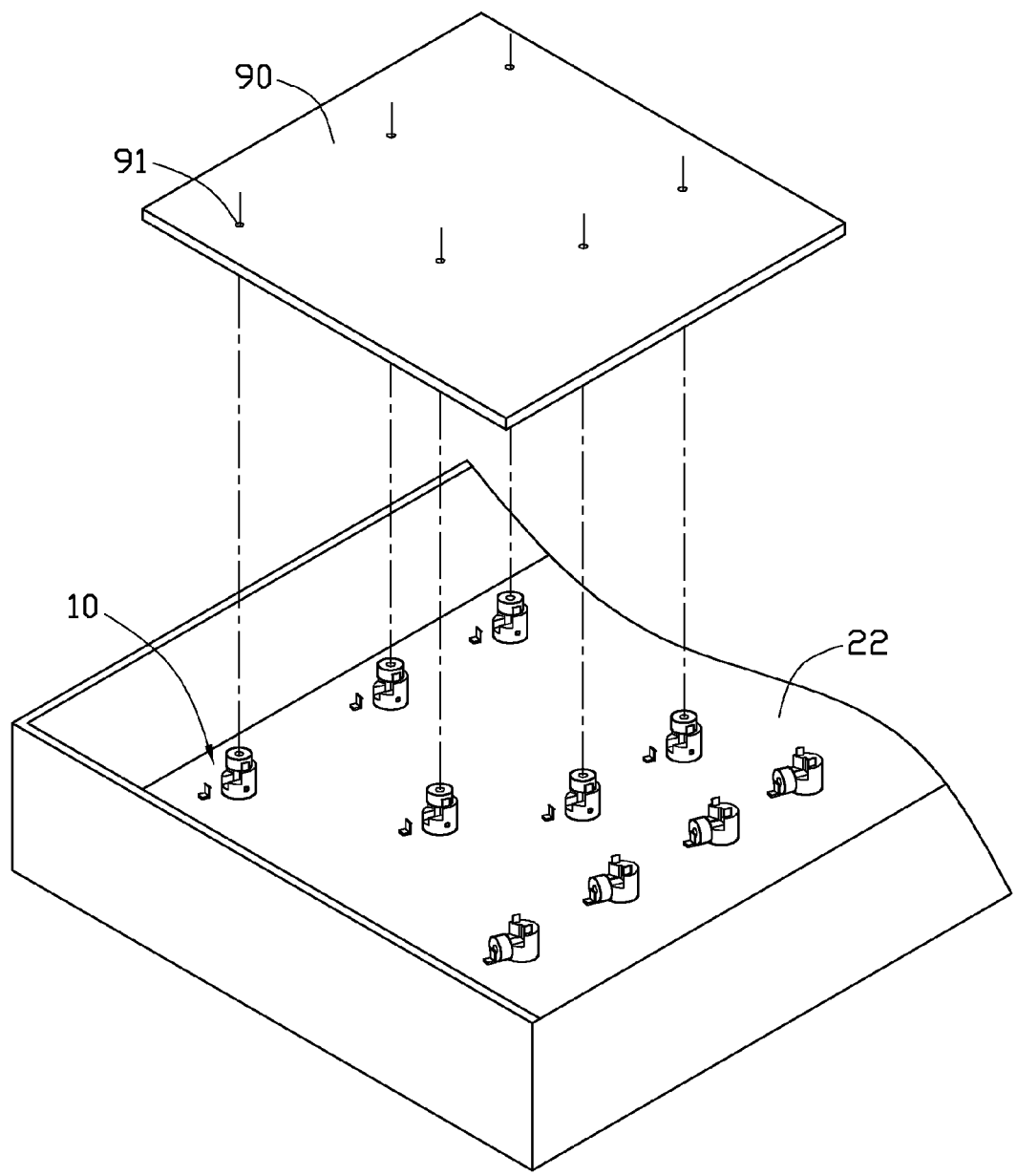
FIG. 4 shows a second motherboard to be mounted to the chassis of FIG. 1.

FIGS. 1, 3 to 4 show an exemplary embodiment of a chassis including a mounting plate 22, and a plurality of fixing apparatuses 10 mounted on the mounting plate 22. The mounting plate 22 defines a plurality of first securing holes 221, and a plurality of second securing holes 222 each at a side of a corresponding first securing hole 221. A first motherboard 80 defines a plurality of first locating holes 81, and a second mounting board 90 defines a plurality of second locating holes 91 can be selectively mounted to the mounting plate 22. Layouts of the first locating holes 81 and the second locating holes 91 are different from each other.

Figure 2:
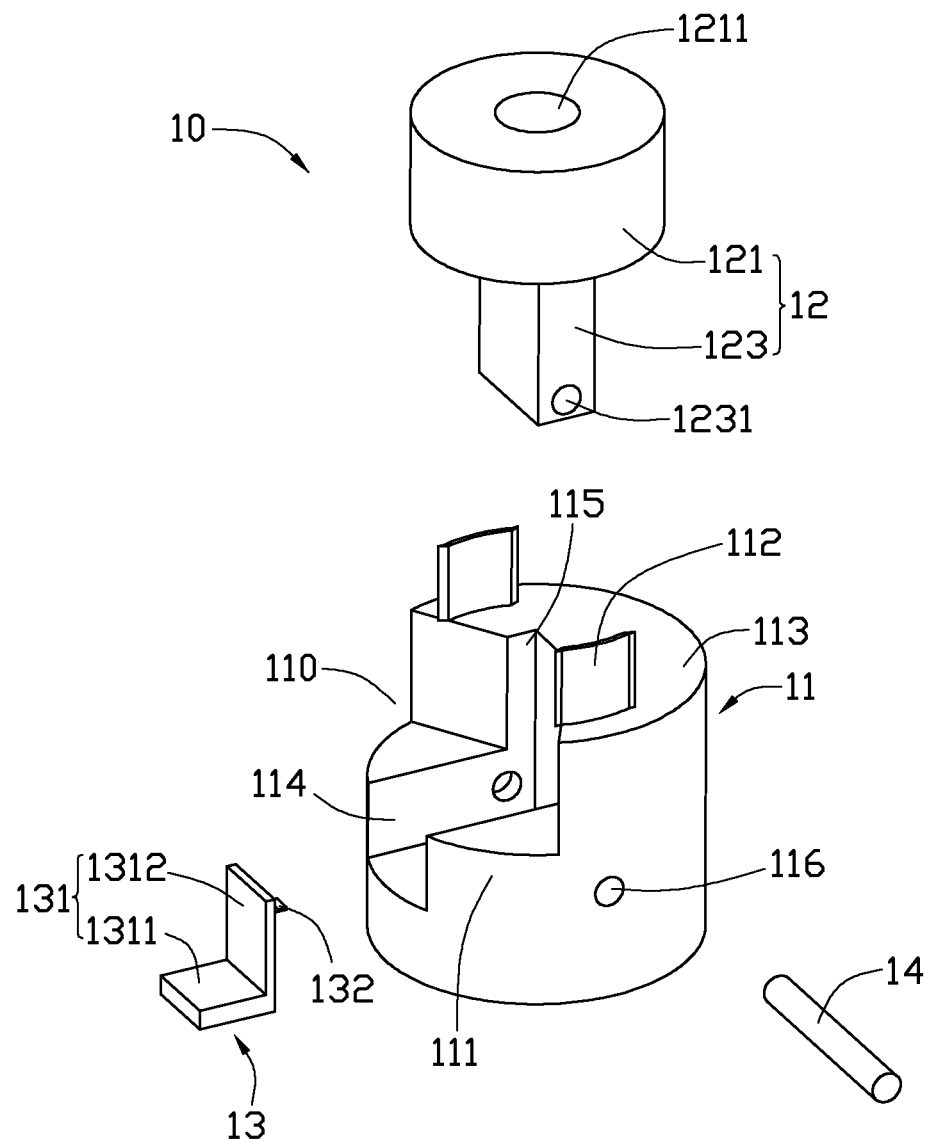
FIG. 2 is an exploded, isometric view of one of the fixing apparatus of FIG. 1.

FIG. 2 shows that each of the fixing apparatuses 10 includes a base member 11, a fastening member 12, a holding member 13, and a shaft 14.

The base member 11 is substantially cylindrical, and includes a lower portion 111, and a fan-shaped block 113 extending up from the lower portion 111. A cutout 110 is defined at a side of the block 113 and above the lower portion 111. A protrusion (not shown) extends from a bottom of the lower portion 111. A radially extending first receiving groove 114 is defined in a top of the lower portion 111, communicating with the cutout 110. A radially extending pivot hole 116 is defined in the lower portion 111, intersecting with the first receiving groove 114. Two resilient tabs 112 extend up from a top of the block 113. An axially extending second receiving groove 115 is defined in a side of the block 111, facing the cutout 110 and communicating with the first receiving groove 114.

The fastening member 12 includes a columnar fastening portion 121, and a connecting portion 123 axially extending down from a bottom end of the fastening portion 121. An internally threaded fastening hole 1211 is axially defined in the fastening portion 121, extending through a top end of the fastening portion 121. The connecting portion 123 is rectangular, and is capable of being engaged in each of the first and second receiving grooves 114 and 115. A pivot hole 1231 is defined in a distal end of the connecting portion 123 away from the fastening portion 121.

The holding member 13 includes a bracket 131 and a resilient locking portion 132. The bracket 131 is L-shaped, and includes a first arm 1311 and a second arm 1312 extending up from an end of the first arm 1311. A protrusion (not shown) extends from a bottom of the first arm 1311. The locking portion 132 slantingly extends from the second arm 1312 away from the first arm 1311.

In assembly, each of the connecting portions 123 is inserted into the first receiving slot 114 of the corresponding base member 11 to align the pivot hole 1231 with the pivot hole 116. One of the shafts 14 is correspondingly engaged in the pivot holes 1231 and 116, to rotatably connect the fastening member 12 to the base member 11.

Each base member 11 is mounted to the mounting plate 22, with the protrusion of the base member 11 secured in a corresponding first securing hole 221. Each holding member 13 is mounted to the mounting plate 22 and aligned with the first receiving groove 114, with the protrusion of the holding member 13 secured in a corresponding second securing hole 222. Therefore, the fixing apparatus 10 is mounted to the mounting plate 22.

Figure 5:
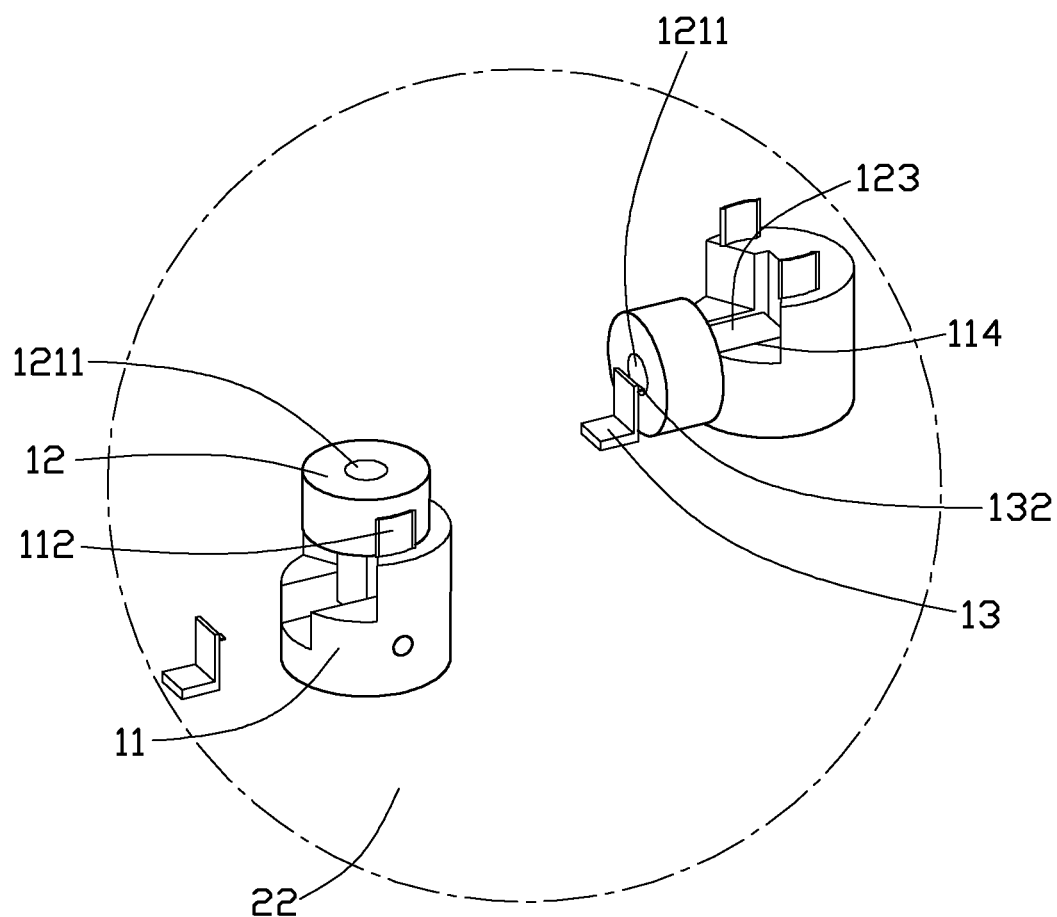
FIG. 5 is an enlarged view of the encircled portion V of FIG. 3.

Referring to FIG. 5, each of the fastening members 12 is rotatable about the shaft 14 between a fastening-ready position and an interference-avoiding position. In the fastening-ready position, the connecting portion 123 is received in the second receiving groove 115, the top end of the fastening member 12 is away from the mounting plate 22, and the axial direction of the fastening hole 1211 aligns with the axial direction of the corresponding base member 11, which is perpendicular to the mounting plate 22. The fastening portion 121 is sandwiched between the resilient tabs 112, to be kept in the fastening-ready position. In the interference-avoiding position, the connecting portion 123 is received in the first receiving groove 114, the fastening portion 121 is adjacent to the mounting plate 22, with the axial direction of the fastening hole 1211 substantially parallel to the axial direction of the base member 11 and the mounting plate 12. The locking portion 132 of a corresponding holding member 13 is engaged in the fastening hole 1211 to keep the fastening member 12 in the interference-avoiding position.

FIG. 3 shows mounting the first motherboard 80 to the chassis, the fastening members 12 corresponding to the first locating holes 81 are rotated to the fastening-ready positions.

The other fastening members 12 are rotated to the interference-avoiding positions to avoid interfering with the first motherboard 80. The first motherboard 80 is supported on the fastening portions 121 of the fastening members 12 on the fastening-ready positions, with the first locating holes 81 aligning with the corresponding fastening holes 112. Screws extend through the first locating holes 81 and engage in the fastening holes 112, thereby fixing the first motherboard 80 to the mounting plate 22.

FIG. 4 shows mounting the second motherboard 90 to the chassis, the fastening members 12 corresponding to the second locating holes 91 are rotated to the fastening-ready positions. The other fastening members 12 are rotated to the interference-avoiding positions to avoid interfering with the second motherboard 90. The second motherboard 90 is supported on the fastening portions 121 of the fastening members 12 on the fastening-ready positions, with the second locating holes 91 aligning with the corresponding fastening holes 112. Screws extend through the second locating holes 91 and engage in the fastening holes 112, thereby fixing the second motherboard 90 to the mounting plate 22.

It is to be understood, however, that even though numerous characteristics and advantages of the embodiment have been set forth in the foregoing description, together with details of the structure and function of the embodiment, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A fixing apparatus comprising:
a base member forming a bottom end and a top end opposite to the bottom end; and
a fastening member defining a fastening hole in a top end of the fastening member, the fastening member being rotatably connected to the base member between a fastening-ready position, where the top end of the fastening member is opposite to and away from the base member, and an axial direction of the fastening hole is collinear with an extending direction from the bottom end to the top end of the base member, and an interference-avoiding position, where the axial direction of the fastening hole intersects with the extending direction from the bottom end to the top end of the base member.

2. The fixing apparatus of claim 1, wherein the fastening member comprises a fastening portion defining the fastening hole and a connecting portion extending down from the fastening portion, each of the connecting portion and the base member defines a pivot hole, a shaft extends through the pivot holes of the connecting portion and the base member to rotatably connect the connecting portion and the base member.

3. The fixing apparatus of claim 2, wherein the fastening portion is columnar, the connecting member axially extends from a bottom end of the fastening portion, the fastening hole is axially defined in a top end of the fastening portion opposite to the bottom end.

4. The fixing apparatus of claim 2, wherein the base member is cylindrical, the extending direction from the bottom end to the top end of the base member is an axis direction of the base member, the base member defines a radially extending first receiving groove to receive the connecting portion when the fastening member in the interference-avoiding position.

5. The fixing apparatus of claim 4, wherein the base member defines an axially extending second receiving groove communicating with the first receiving groove, to receive the connecting portion when the fastening member in the fastening-ready position.

6. A chassis allowing to selectively mounting motherboards with different layouts of locating holes, the chassis comprising:
a mounting plate; and
a plurality of fixing apparatus, each comprising a base member secured to the mounting plate, and a fastening member defining a fastening hole in a top end, the fastening member being rotatably connected to the base member between a fastening-ready poison and an interference-avoiding position;
wherein when mounting one of the motherboards, some of the fastening members whose layout is similar to the locating holes of the motherboard are rotated to the fastening-ready poisons to make the fastening holes of the fastening members align with the locating holes of the motherboard, the other fastening members are rotated to the interference-avoiding positions to avoid interfering with the motherboard.

7. The chassis of claim 6, wherein a bottom of each of the base members is secured to the mounting plate, each of the fastening members comprises a fastening portion defining the fastening hole, the fastening portion is located above the base member in response to the fastening member in the fastening-ready position, the fastening portion is arranged adjacent to the mounting plate in response to the fastening member in the interference-avoiding position.

8. The chassis of claim 7, wherein each of the fastening members further comprises a connecting member extending down from a bottom end of the fastening portion, and rotatably connected to the base member with a bottom end opposite to the fastening portion, the top end of the fastening portion is directed opposite to the mounting plate, in response to the fastening member in the fastening-ready position.

9. The chassis of claim 8, wherein an axial direction of the fastening hole of each of the fastening members is perpendicular to the mounting plate, in response to the fastening member in the fastening-ready position, while the axial direction of the fastening hole of each of fastening members is substantially parallel to the mounting plate, in response to the fastening member in the interference-avoiding position.

10. The chassis of claim 7, wherein two resilient tabs extend from a top of each of the base members, each of the fastening portions is sandwiched between the resilient tabs of a corresponding base member, in response to the fastening member in the fastening-ready position.

11. The chassis of claim 7, wherein each of the fixing apparatuses further comprises a holding member secured to the mounting plate and adjacent to the base member, the holding member engages with the fastening portion of the corresponding fastening member, in response to the fastening member in the interference-avoiding position.

12. The chassis of claim 11, wherein each of the holding members comprises a locking portion to be engaged in the fastening hole of the corresponding fastening member.

* * * * *